(12) United States Patent
Mullen et al.

(10) Patent No.: US 7,538,424 B2
(45) Date of Patent: May 26, 2009

(54) SYSTEM AND METHOD FOR DISSIPATING HEAT FROM A SEMICONDUCTOR MODULE

(75) Inventors: Donald R. Mullen, Mountain View, CA (US); Ming Li, Fremont, CA (US)

(73) Assignee: Rambus Inc., Los Altos, CA (US)

( * ) Notice: Subject to any disclaimer, the term of this patent is extended or adjusted under 35 U.S.C. 154(b) by 662 days.

(21) Appl. No.: 10/888,907

(22) Filed: Jul. 8, 2004

(65) Prior Publication Data
US 2006/0006525 A1    Jan. 12, 2006

(51) Int. Cl.
H01L 23/34    (2006.01)
(52) U.S. Cl. ........................................ 257/712; 257/774
(58) Field of Classification Search .................. 257/712, 257/774, 720
See application file for complete search history.

(56) References Cited

U.S. PATENT DOCUMENTS

| | | | |
|---|---|---|---|
| 5,708,566 A | 1/1998 | Hunninghaus et al. | |
| 5,923,084 A * | 7/1999 | Inoue et al. | 257/712 |
| 6,608,379 B2 * | 8/2003 | Yeo et al. | 257/706 |
| 6,657,296 B2 | 12/2003 | Ho et al. | |
| 6,657,311 B1 | 12/2003 | Hortaleza et al. | |
| 6,657,864 B1 | 12/2003 | Dyckman et al. | |
| 6,685,454 B2 | 2/2004 | Brand | |

* cited by examiner

*Primary Examiner*—Roy K Potter
(74) *Attorney, Agent, or Firm*—Morgan, Lewis & Bockius LLP

(57) ABSTRACT

The system includes a circuit board, a semiconductor module, a heat dissipator, and at least one thermal via. The circuit board has substantially flat opposing first and second sides. The semiconductor module includes multiple semiconductor devices. The semiconductor module is oriented substantially parallel to the circuit board near the first side, while the heat dissipator is disposed near the second side. The thermal via extends through the circuit board to thermally couple the semiconductor module to the heat dissipator, which may be a heat spreader, heat sink, cooling fan, or heat pipe.

77 Claims, 11 Drawing Sheets

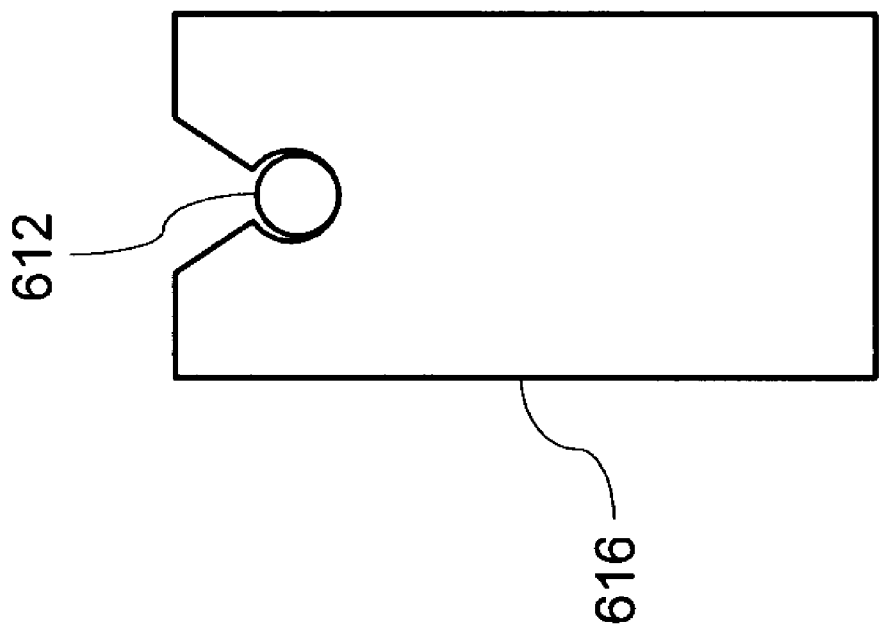

SYSTEM AND METHOD FOR DISSIPATING HEAT FROM A SEMICONDUCTOR MODULE

TECHNICAL FIELD

The embodiments disclosed herein relate to a semiconductor module, and in particular to a system and method for dissipating heat from a semiconductor module via a circuit board to which the semiconductor module is attached.

BACKGROUND

As computer systems evolve, so does the demand for increased semiconductor processing power and memory. However, increases in semiconductor processing power and memory typically come at a cost, namely an increase in power consumption of semiconductor devices. Besides the obvious drawbacks of increased energy costs and shorter battery life, increased power consumption also leads to significantly higher operating temperatures of the semiconductor devices. However, in order for the semiconductor devices to operate, heat generated by the semiconductor devices must be dissipated.

Moreover, computer systems often utilize multiple semiconductor devices. Accordingly, manufacturers often bundle multiple semiconductor devices into a single package, otherwise known as a semiconductor module. These semiconductor modules are particularly prevalent in the memory industry, where multiple memory devices are packaged in discrete memory modules. However, packaging multiple semiconductor devices in a single semiconductor module leads to even greater heat generation within the module. This increased heat generation makes subsequent heat dissipation difficult.

Not only has the demand for increased processing power and memory been rapidly increasing, but there has also been a steady increase in demand smaller modules having greater processing power and/or memory. However, any increase in the density of the semiconductor devices within a module exacerbates the heat generation and subsequent dissipation problems.

Even more of a problem arises when high powered memory modules are used in portable computing systems, such as handheld computers, laptops, and cellular phones, where space is at a premium. Unlike desktop computers that have a relatively large volume of unused space within the computer chassis or case, the chassis of portable computing systems typically have little or no space for air to circulate in and around the memory module. For example, Small Outline Dual In-line Memory Modules (SO-DIMMs or SODIMMs), are typically used in notebook computers and rack-mounted servers for their small size as compared to regular Dual In-line Memory Modules (DIMMs), which are typically used in desktop computers. However, due to the form factor of notebook computers, such SODIMMs are typically placed parallel to the laptop's motherboard and not perpendicular, as is typically the case with memory modules in desktop computers. Memory devices on the side of the memory module facing away from the circuit board can dissipate some heat. However, memory devices facing the motherboard typically only have a very small space between the memory module and the motherboard and therefore have poor heat dissipation, as little or no air circulates around the small space between the memory module and the mother-board.

Accordingly, a system and method to more effectively dissipate heat from a semiconductor module would be highly desirable.

BRIEF DESCRIPTION OF THE DRAWINGS

For a better understanding of the nature and objects of the invention, reference should be made to the following detailed description taken in conjunction with the accompanying drawings, in which:

FIG. 6B is a front view of the latch shown in FIG. 6A.

Like reference numerals refer to the same or similar components throughout the several views of the drawings.

DETAILED DESCRIPTION OF THE EMBODIMENTS

The following description details various systems for dissipating heat from a semiconductor module disposed within a computing system. Most of these systems include a semiconductor module located on one side of a circuit board, and a heat dissipator located on the other side of the circuit board. One or more thermal vias then extend through the circuit board to thermally couple the semiconductor module to the heat dissipator. Accordingly, these systems increase overall heat dissipation from the semiconductor module by facilitating heat dissipation through the circuit board. This increased heat dissipation lowers the operating temperature of the semiconductor module, thereby reducing semiconductor device malfunctions and increasing the life of the semiconductor devices. In embodiments, due to better heat dissipation, the semiconductor devices may operate at higher frequencies. The increased heat dissipation also efficiently addresses confined space considerations associated with portable computing devices. Furthermore, the increased heat dissipation also addresses the above described problems associated with high powered processors and memory, as well as the problems associated with increased semiconductor device density within semiconductor modules.

Figure 1A:
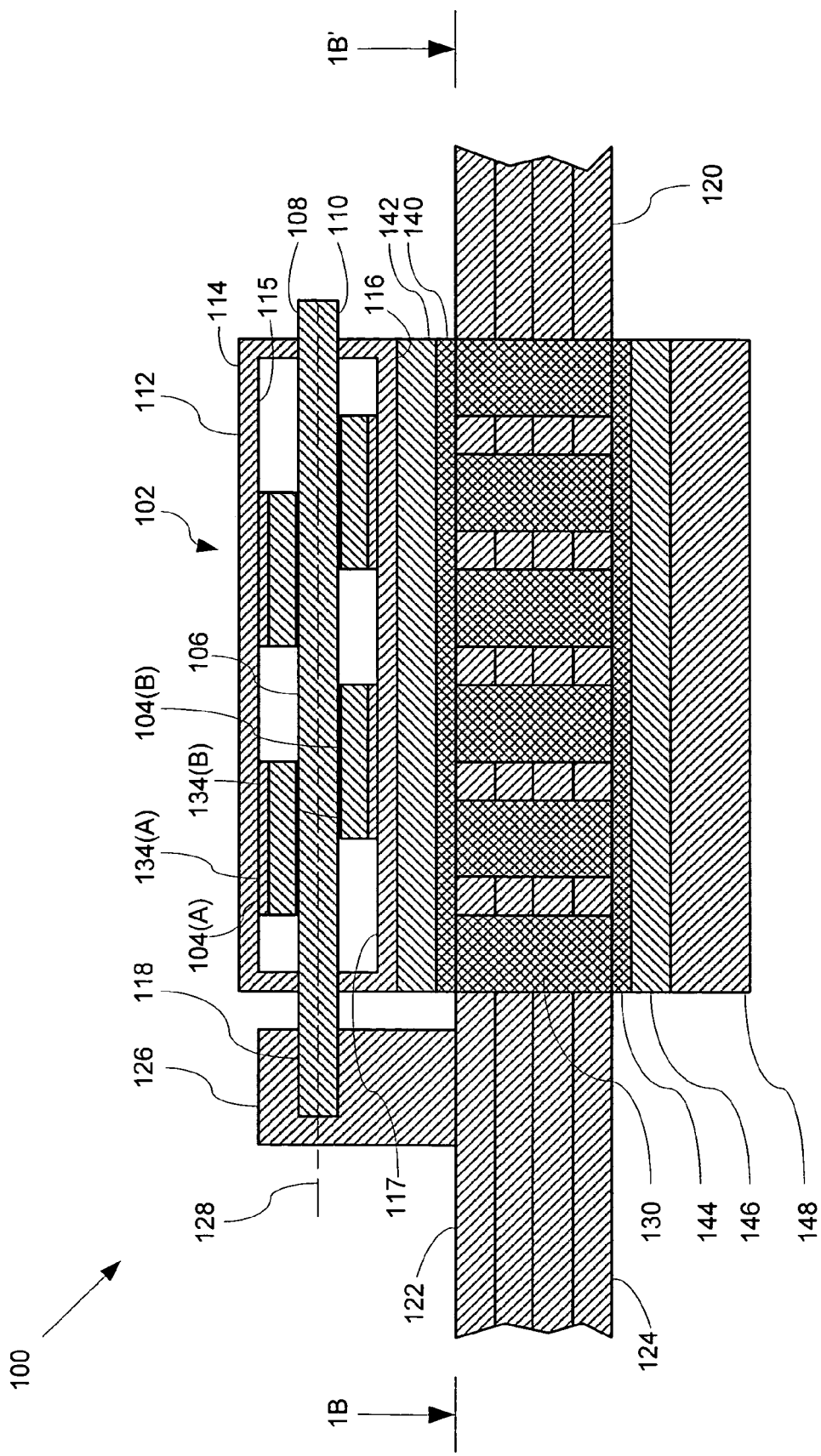
FIGS. 1A, 2, 3A, 4, 5, 6A, 7, and 8 are all partial cross sectional views of different systems for dissipating heat from a semiconductor module.

FIG. 1A is a partial cross sectional view of a system 100 configured to dissipate heat from a semiconductor module 102. The semiconductor module 102 includes multiple integrated circuits or semiconductor devices 104. These semiconductor devices 104 may be electrically and mechanically coupled to a semiconductor module circuit board 106. The semiconductor circuit board has substantially flat opposing sides, namely a first side 108 and second side 110. In some embodiments, some semiconductor devices 104(A) are positioned on the first side 108 of the semiconductor module circuit board 106, while other semiconductor devices 104(B) are positioned on the second side 110 of the semiconductor module circuit board 106. The semiconductor devices 104 and/or semiconductor module circuit board 106 may be enclosed at least partially within a semiconductor module housing 112. If present, the semiconductor module housing 112 has opposing sides, namely a first exterior side 114, a first interior side 115, a second exterior side 116, and a second interior side 117. The sides of semiconductor devices 104 that are not coupled to the semiconductor module circuit board 106 are attached to the semiconductor module housing 112 using a thermal interface material (TIM) 134. In other words, the semiconductor devices 104(A) and 104(B) are attached to the first interior side 115 and second interior side 117 of the semiconductor module housing 112 using TIM 134(A) and 134(B) respectively.

The semiconductor module circuit board 106 may include an electrical connector, such as a card-edge connector 118, for electrically connecting the semiconductor module 102 to the remainder of the system 100.

In some embodiments the semiconductor module 102 is a SODIMM typically used in portable computing systems, such as laptop or notebook computers. Alternatively, the semiconductor module 102 may be a SIMM (single in-line memory module) or a DIMM.

The system 100 includes a circuit board 120, such as a computer system's motherboard, printed wiring board, printed circuit board (PCB), interconnect substrate or the like. In some embodiments, the circuit board 120 is a multilayer FR-4 motherboard. The circuit board 120 has two substantially flat opposing sides, namely a first side 122 and a second side 124.

Attached to the circuit board is at least one connector 126 for mechanically and/or electrically coupling the semiconductor module 102 to the circuit board 120. In some embodiments, the connector 126 is coupled to the circuit board 120 at the circuit board's first side 122. Also in some embodiments, the connector 126 is a horizontal connector that includes a female slot for receiving the male card-edge connector 118 of the semiconductor module 102. The horizontal connector orients the semiconductor module parallel to the circuit board, leaving a small gap between the semiconductor module and circuit board. Alternatively, the connector 126 may be any ISA Bus slot, multi-pin socket, DIMM bank, or the like for electrically coupling the module 102 to the circuit board 120.

In this embodiment, once coupled to the connector 126, the semiconductor module 102 is oriented substantially parallel to the circuit board 120, i.e., a longitudinal axis 128 of the semiconductor module circuit board 106 is oriented substantially parallel to the circuit board 120. This orientation is common for SODIMMs found in portable computing systems, as vertical space (perpendicular to the circuit board 120) within the portable computing devices is limited. For example, many laptop or notebook computers are currently less than 1 inch (25 mm) thick. SODIMMs are generally over 1 inch (25 mm) in height, but generally have a thickness of only 0.1 inch (2.5 mm). Accordingly, manufacturers tend to orient SODIMMs parallel to the notebook computer's motherboard to conserve vertical space. This translates into a thinner notebook computer.

As described above, if not addressed, heat dissipation problems for higher powered semiconductor devices 104 may arise with this parallel orientation of the semiconductor module 102 with respect to the circuit board 120. Generally, heat generated by the semiconductor devices 104(A) on the first side 108 of the semiconductor module circuit board 106 dissipates away from the semiconductor module 102 through both the circuit board 106 and TIM 134(A) to the first exterior side 114 of the semiconductor module housing 112, i.e., heat could dissipate effectively upwards in FIG. 1A from the first interior side 115 to the exterior side 114 of the semiconductor module housing 112. If necessary, other cooling means like heat sink, heat spreader or system chassis/case could attach to this first exterior side 114 to dissipate more heat from semiconductor devices 104(A), as described below. However, heat generated by the semiconductor devices 104(B) on the second side 110 of the semiconductor module circuit board 106 cannot be dissipated as effectively. This is because heat generated by the semiconductor devices 104(B) is dissipated through the TIM 134(B) from the second interior side 117 to the second exterior side 116 of the semiconductor module housing 112 and is blocked by the second side 110 of the circuit board 106, i.e., heat can only dissipate downwards in FIG. 1A. This problem is exacerbated by manufacturers who leave almost no space between the second side 116 of the semiconductor module housing 112 and the circuit board 120, in order to conserve space perpendicular to the circuit board 120. Accordingly, the present embodiment addresses the above described heat build-up between the semiconductor module 102 and the circuit board 120 by transferring or conducting heat through the circuit board 120 using one or more thermal vias 130.

The one or more thermal vias 130 are formed through the circuit board 120 to conduct heat from the first side 122 of the circuit board 120 to the second side 124 of the circuit board 120. The thermal vias 130 are any thermally conductive material that is capable of transferring or conducting heat through the circuit board 120.

Figure 1B:
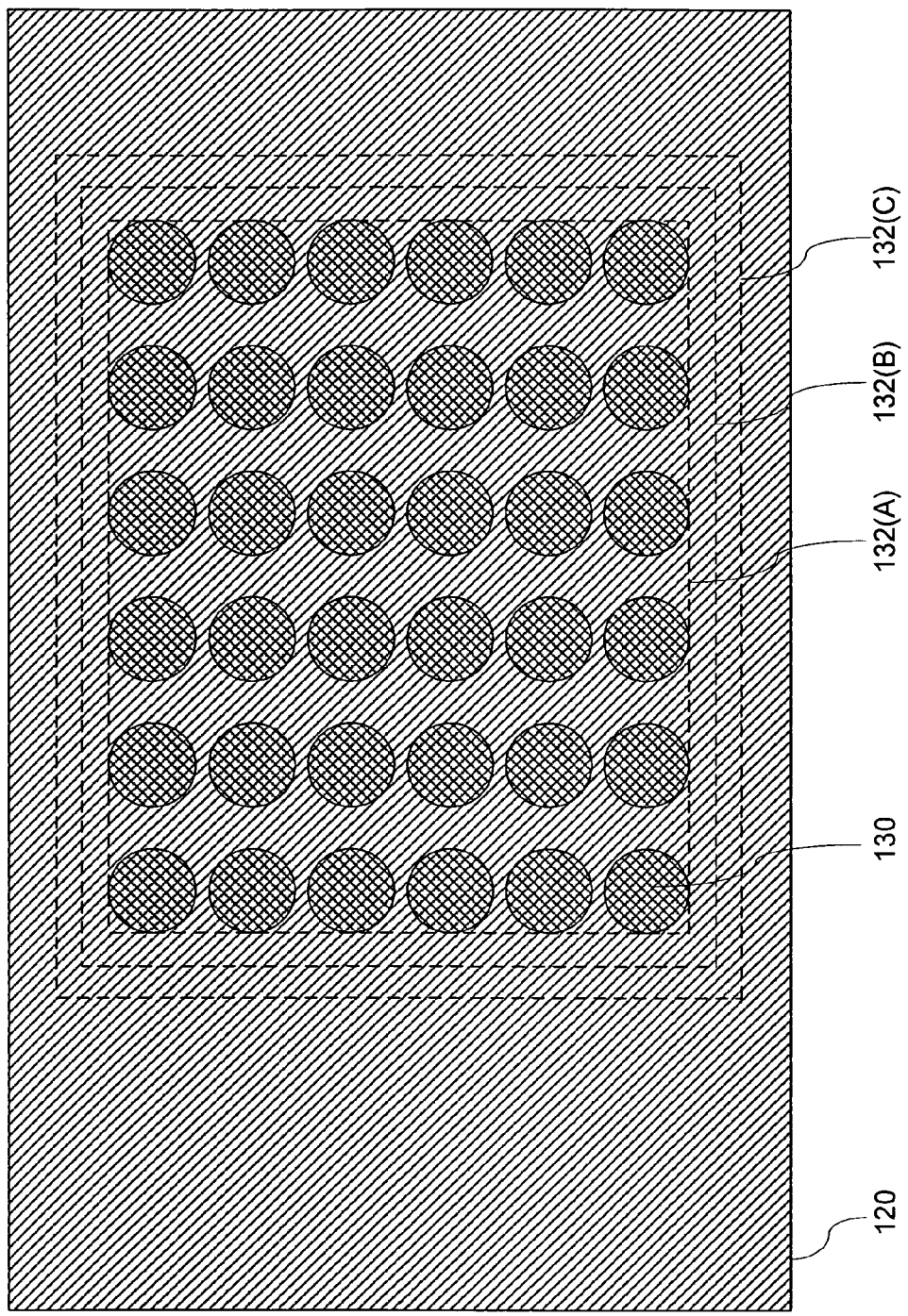
FIG. 1B is partial cross sectional view of the system shown in FIG. 1A, taken along line 1B-1B'.

In some embodiments, the thermal vias 130 form an array of hollow vias through the circuit board 120. In other embodiments, the thermal vias 130 are hollow vias plated with a thermally conductive material, such as copper, gold, aluminum, magnesium, tungsten, or the like. In yet other embodiments, the thermal vias 130 are posts of thermally conductive material, as shown in FIGS. 1A and 1B. The posts may be solid, e.g. solid copper or gold, hollow vias filled with a thermally conductive material, or hollow vias plated with a thermally conductive material and then filled with a thermally conductive material. The thermally conductive material used to fill the hollow vias may be a thermally conductive paste, such as solder based paste (later reflowed), epoxy based pastes with or without alumina or boron nitride fillers, 80% tungsten and 20% copper powder mixer, or no-shrink via filler material (Peters SD 2361), etc. These posts provide better thermal conductivity than hollow or plated vias.

Although not necessary, the overall region or area 132(A), 132(B) and/or 132(C) (FIG. 1B) of the array of thermal vias 130 facing the semiconductor module 102 cover at least as large an area as the semiconductor devices 104(B) or the side 116 of the semiconductor module 102, as best seen in both FIGS. 1A and 1B. In other words, the location of the thermal vias 130 should correspond to the location of the semiconductor devices 104(B) and/or the second side 116 of the semiconductor module 102 facing the circuit board 120. The overall area 132 of the thermal vias 130 facing the semiconductor module 102 may of course be smaller or larger that the semiconductor devices 104(B) or semiconductor module 102.

Furthermore, the array of thermal vias 130, as shown in FIG. 1B, should be as densely packed as possible, while addressing other considerations of the circuit board design and manufacture. In other words, the more thermal vias 130 through the circuit board 120, the better the thermal conductivity through the circuit board and away from the semiconductor module 102.

In some embodiments, where wire routing on the circuit board 120 is allowed, a first layer 140 extends across the top openings of thermal vias 130 at the first side 122 of the circuit board 120, as shown in FIGS. 1A and 1B. This first layer 140 may form part of the first side 122 of the circuit board 120 and covers the array of thermal vias 130. Likewise, a second layer 144 may form part of the second side 124 of the circuit board 120, and extend over the array of thermal vias 130. In some embodiments, the first and second layers are solid copper layers. The thickness of first and second layers 140 and 144 may vary from 17.5 to 70 microns depending on plating technology that the circuit board 120 employs. It should be noted that the thickness of first and second layers 140 and 144 may be same or different.

In some embodiments, the first and second layers cover the array of thermal vias 130 on the first and second sides 122 and 124 of the circuit board 120. In other words, the size of the first and second layers 140 and 144 may be same as area 132(A), 132(B) or 132(C). Therefore, in some embodiments, the first and second layers may mirror one another in size and location above and below the circuit board 120. Alternatively, the size of layers 140 and 144 may be different. Also, the first and second layers 140 and 144 may act as heat spreading layers to spread heat.

Returning to FIG. 1A, the system 100 may also include third layer 142 and fourth layer 146 of thermal interface material or TIM disposed on top of the first and second layers 140 and 144 respectively. The TIM is any thermally conductive material. In some embodiments, the TIM may be a fluidic material that sets or cures hard. In other embodiments, the TIM may be a material having viscosity, elasticity or resiliency, or a material that has viscosity, elasticity or resiliency once set or cured. In some embodiments the same TIM is used as fill in the thermal vias 130, i.e., the same material is used to construct the thermal vias as to form the first and/or second layers adjacent to the circuit board.

In the embodiment shown in FIG. 1A, the third layer 142 thermally couples the first layer 140 to the semiconductor module 102, and the fourth layer 146 thermally couples the second layer 144 to a heat dissipator 148. Alternatively, the first and second layers 140 and 144 may be absent and the third and fourth layers 142 and 146 may directly contact the first side 122 and second side 124 of the circuit board 120 respectively. By thermally coupled it is meant that the components thermally coupled to one another can transfer or conduct heat between one another.

In some embodiments, the third layer 142 is formed from a resilient or elastic TIM that is compressed when the semiconductor module 102 is coupled to the connector 126. The thickness of the third layer may be slightly larger than the gap height between the semiconductor module and the first layer 140. In some embodiments, this increases the likelihood of proper thermal coupling between the third layer 142 and the semiconductor module 102. Also in some embodiments, the thickness of the third layer may be between 100% and 120% of the gap height between the semiconductor module and the first layer 140. Furthermore, the fourth layer 146 may have adhesive properties to couple the heat dissipator 148 to the second copper plane 144.

Figure 2:
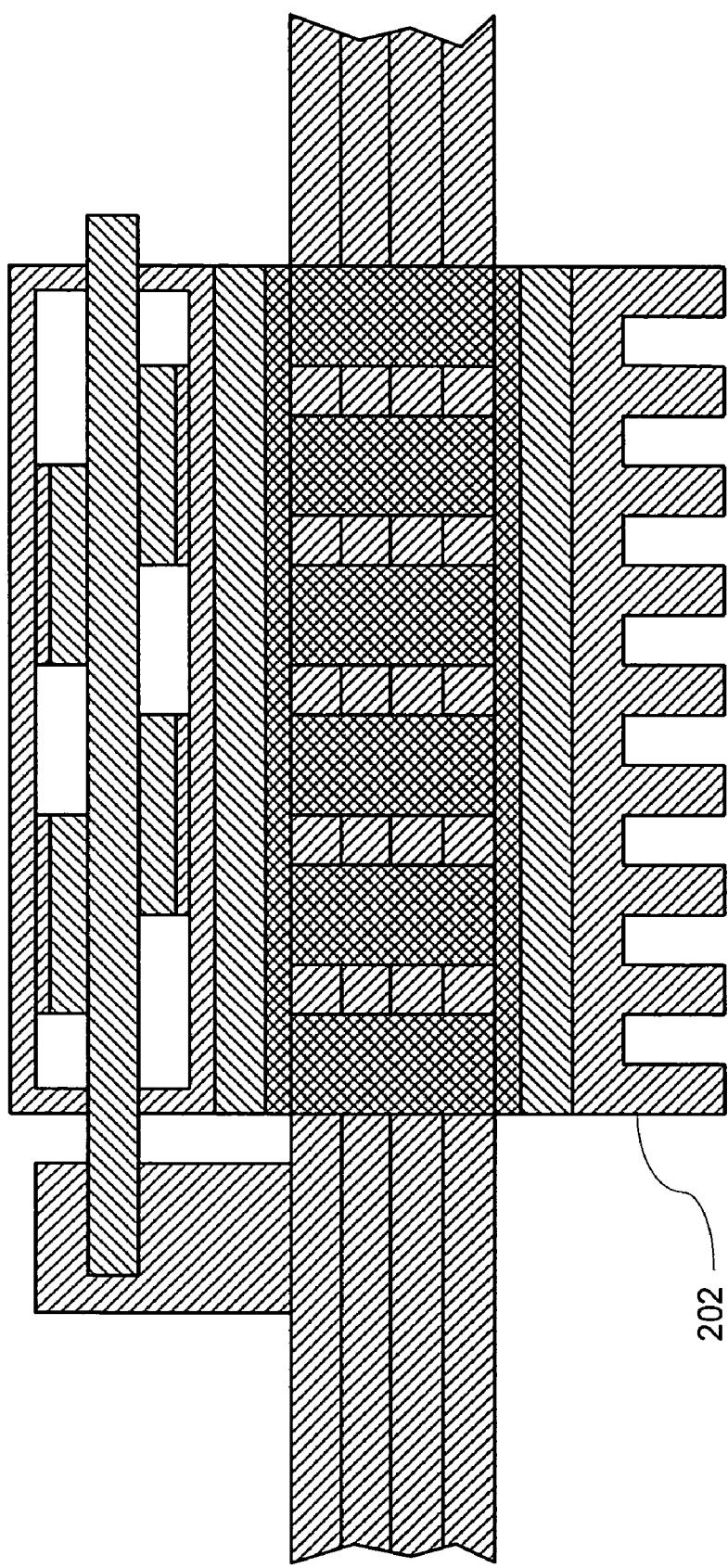

The heat dissipator 148 may be any suitable device for dissipating heat. In some embodiments, as shown in FIG. 2, the heat dissipator 148 (FIG. 1) is a suitable heat sink or heat spreader 202. The heat sink or heat spreader 202 is configured to dissipate heat absorbed from the semiconductor module 102 through the various layers 140, 144, 142 and/or 146 and thermal vias 130. Heat is dissipated to the area surrounding the heat spreader 202. In some embodiments, the heat spreader 202 has multiple fins to increase the surface area of the heat spreader 202 that is exposed to the surrounding air. The increased surface area improves heat dissipation. The heat spreader is made from any suitable thermally conductive material, such as aluminum, copper or magnesium and their alloys.

Figure 3A:
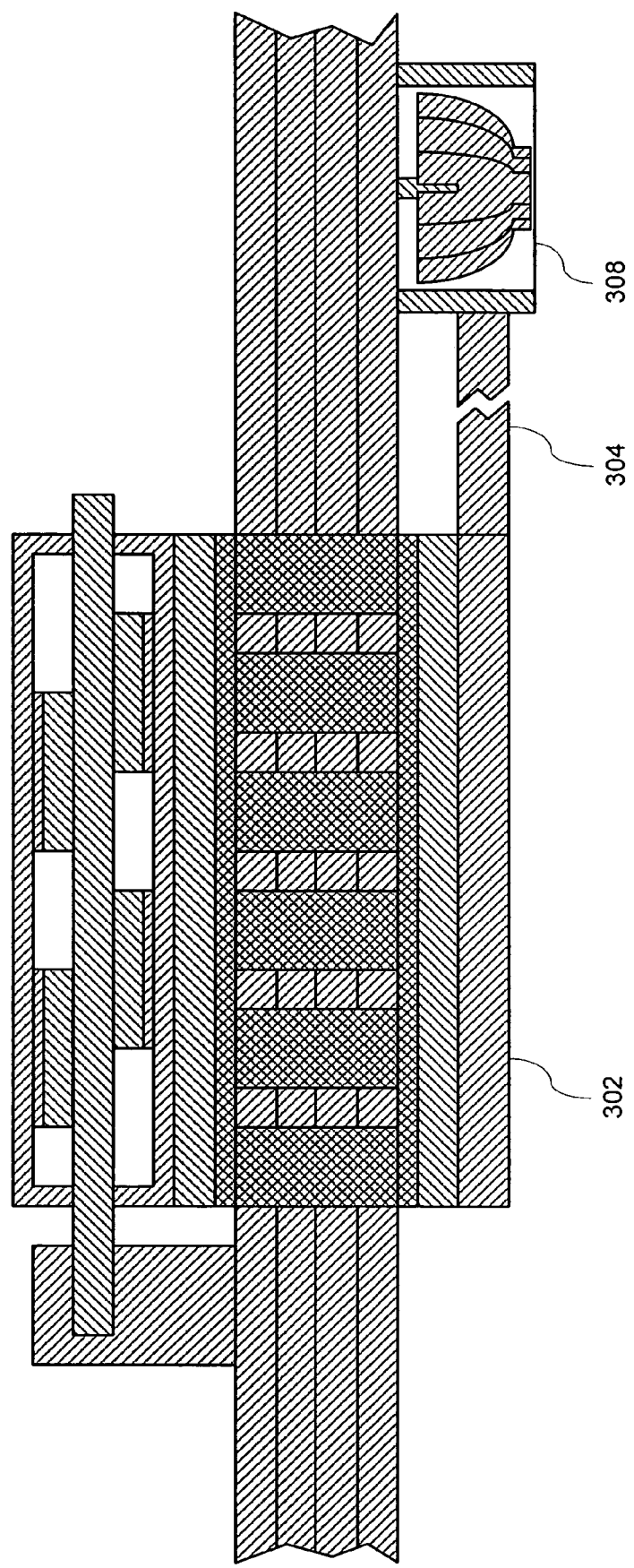
Figure 3B:
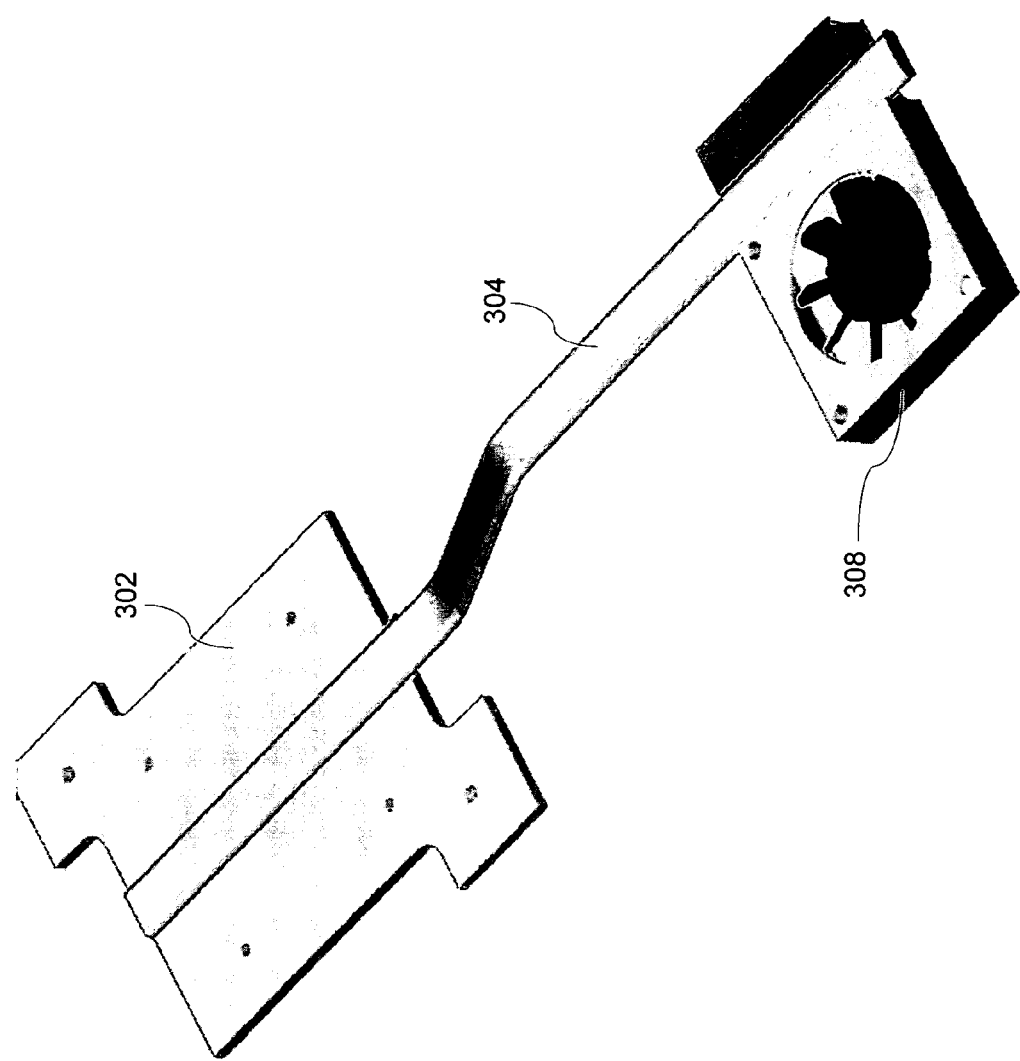
FIG. 3B is an isometric view of the heat dissipation mechanism shown in FIG. 3A.

In another embodiment, shown in FIGS. 3A and 3B, the heat dissipator 148 (FIG. 1) includes a heat spreader 302 thermally coupled to a heat sink, heat spreader, or cooling fan 308. The heat spreader 302 may be thermally coupled to the heat sink or spreader, or cooling fan 308, via a heat pipe 304. The heat spreader 302, heat pipe 304 and heat sink, heat spreader, or cooling fan 308 are all thermally conductive.

The heat spreader 302 is thermally coupled to the semiconductor module 102 through the various layers 140, 144, 142 and/or 146 and thermal vias 130 (all of FIG. 1). Heat absorbed by the heat spreader 302 is transferred or conducted along the heat pipe 304 to the heat sink, heat spreader, or cooling fan 308, where it is dissipated.

In some embodiments, the heat pipe 304 is a thermally conductive sleeve (aluminum, copper, etc.) that holds a liquid (water, acetone, etc.) under pressure, and the inner surface of the sleeve is lined with a porous material that acts as a wick. When heat is applied to the outer area of the sleeve at the heat spreader 302, the liquid inside the tube boils and vaporizes into a gas that moves through the sleeve seeking a cooler location (at the heat sink, heat spreader, or cooling fan 308) where it condenses. Using capillary action, the wick transports the condensed liquid back to the evaporation area at the heat spreader 302.

The heat sink, heat spreader, or cooling fan 308 is preferably placed at a location that is easier to cool. For example, the cooling fan 308 may be located underneath a notebook computer and be exposed to the ambient air surrounding the notebook computer's chassis. In some embodiments, the same heat sink, heat spreader, or cooling fan 308 may be used to cool the notebook computer's CPU and its memory. Also in some embodiments, the heat sink or heat spreader 308 may be the exterior wall of the computing device's chassis or case. In this embodiment, the combination of heat pipe coupled to the chassis or case eliminates the need for a fan.

Figure 4:
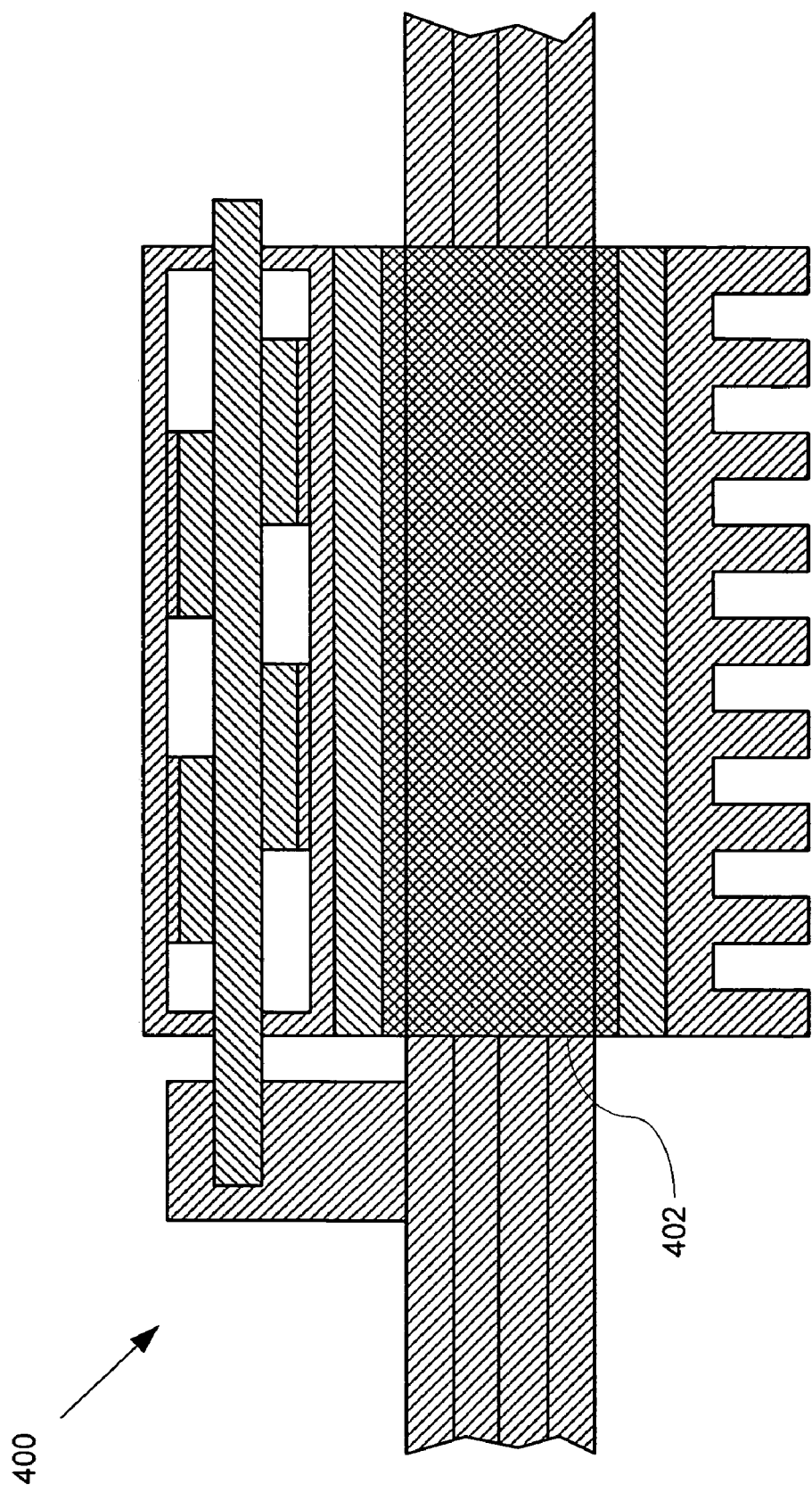

FIG. 4 is a partial cross-sectional view of another system 400 for dissipating heat from a semiconductor module. In this embodiment, the thermal vias 130 of FIG. 1 have been replaced by one large thermal via 402. The thermal via 402 is similar to the thermal vias 130 (FIG. 1). The thermal via 402 may be a solid metal or it may be a thermally conductive paste that maximizes thermal conductivity through the circuit board 120 (FIG. 1).

Figure 5:
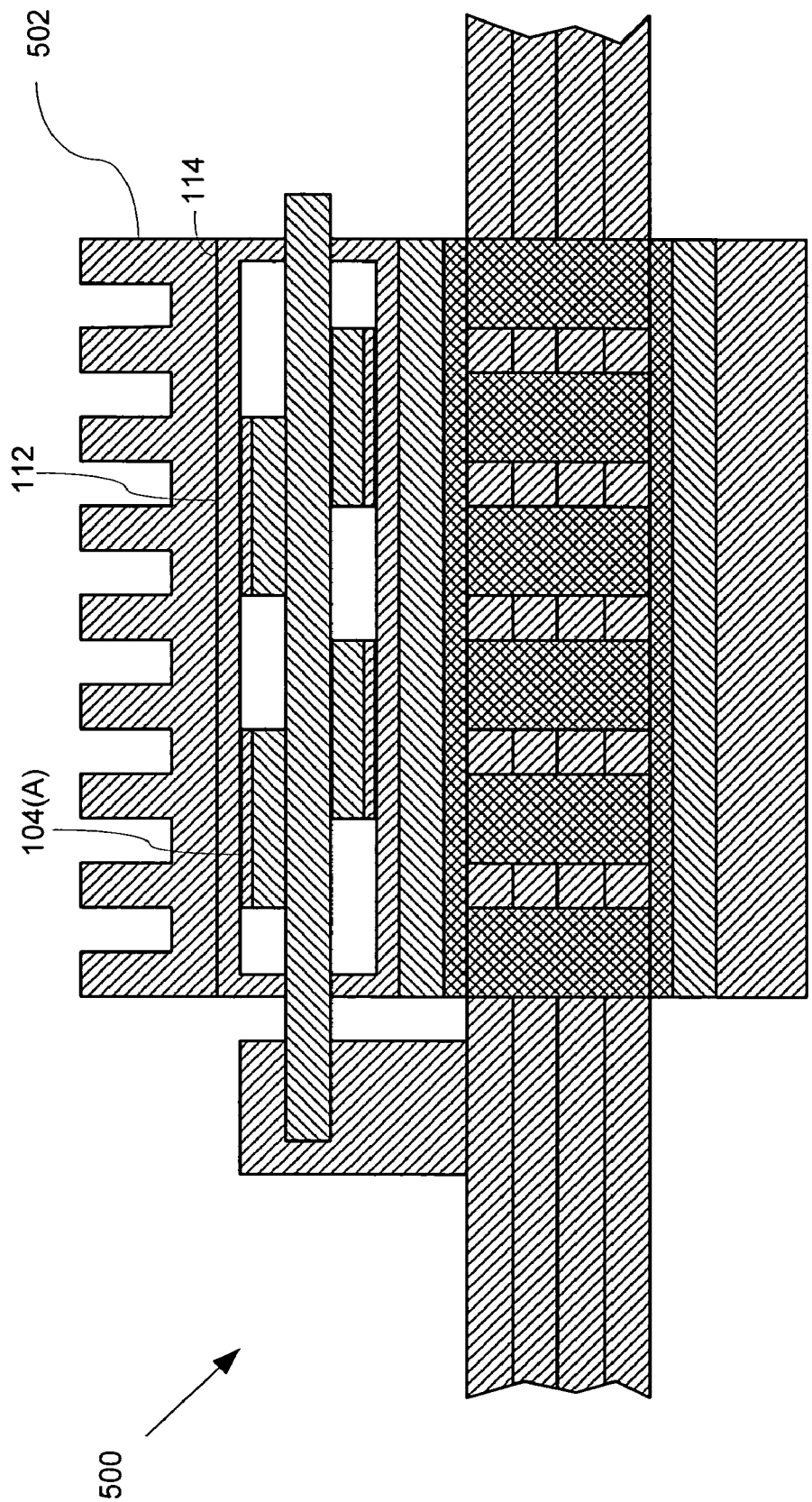

FIG. 5 is a partial cross-sectional view of yet another system 500 for dissipating heat from a semiconductor module. Here, an additional heat sink or spreader 502 is thermally coupled to the side 114 of the semiconductor module 102 (FIG. 1A) furthest from the circuit board 120 (FIG. 1A). The heat spreader 502 may be affixed to the semiconductor module housing 112 using a thermally conductive adhesive. Alternatively, the heat spreader 502 may be affixed directly to the exposed surface of the semiconductor devices 104(A) furthest from the circuit board 120 (FIG. 1A), in embodiments where the first side 114 of the semiconductor module housing 112 is not present. Accordingly, in this embodiment, the semiconductor module 102 (FIG. 1A) may be distributed with the heat spreader 502 affixed to one side thereof. This configuration has the additional advantage that the semiconductor module cannot be inserted into the connector 126 (FIG. 1A) with the wrong side up, a problem that is typically addressed by keying the card-edge connector 118 (FIG. 1A) and the connector 126 (FIG. 1A).

In some embodiments, the heat spreader 502 has multiple fins to increase the surface area of the heat spreader 502 that is exposed to the surrounding air. The increased surface area improves heat dissipation. The heat spreader is made from any suitable thermally conductive material, such as aluminum. Accordingly, in use, the heat spreader 502 and the heat dissipator 148 (FIG. 1A) collectively dissipate heat away from the semiconductor module 102 (FIG. 1A).

Figure 6A:
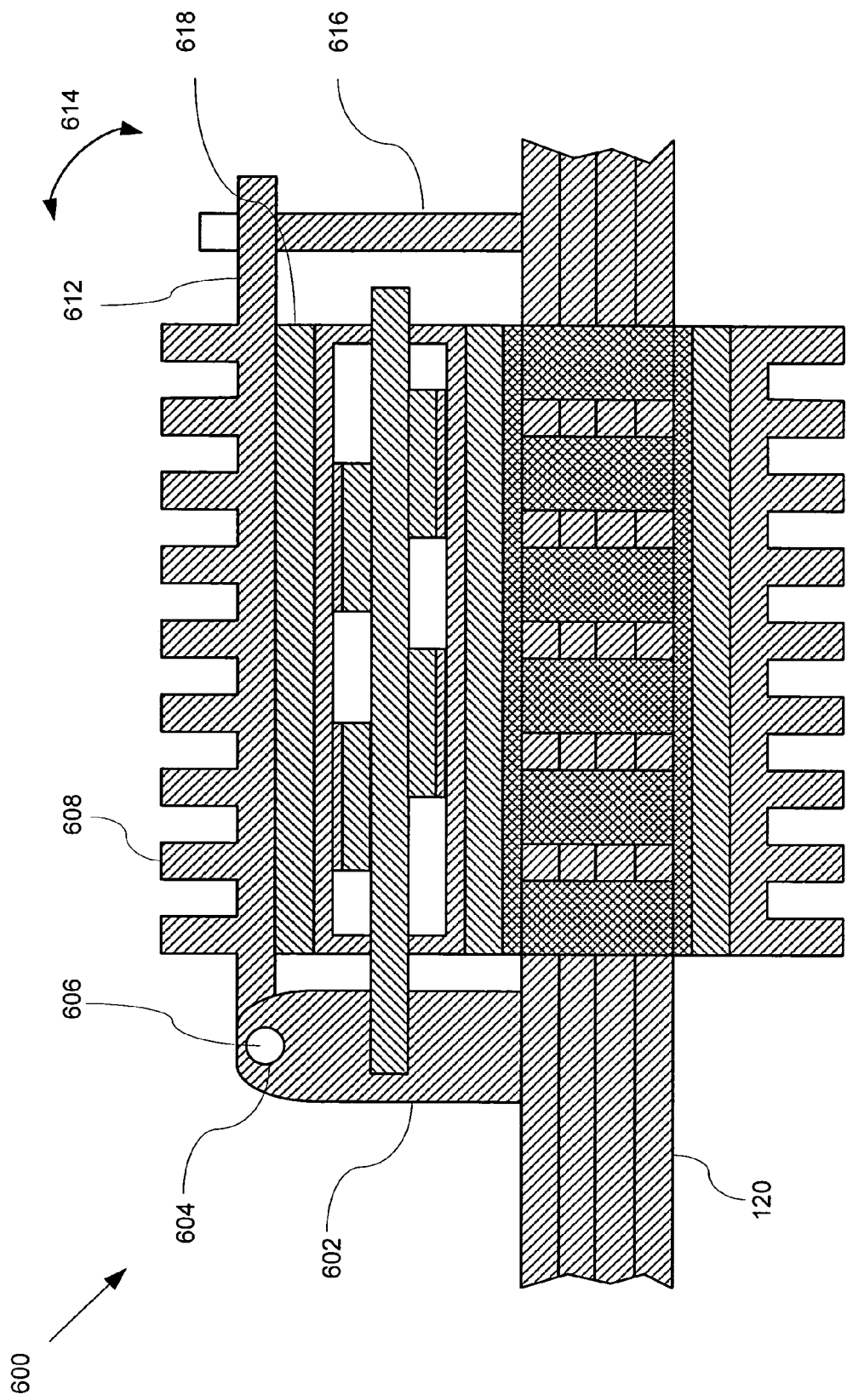

FIG. 6 is a partial cross-sectional view of another system 600 for dissipating heat from a semiconductor module. In this embodiment, the connector 602 includes a bearing 604 in which a rotatable pivot 606 is positioned. The rotatable pivot 606 is coupled to a heat sink or spreader 608, thereby allowing the heat spreader 608 to rotate about the pivot 606 as shown by arrow 614. The heat spreader 608 is similar to the heat spreaders described above. The heat spreader 608 also includes an arm 612 that extends from, and substantially parallel to, the heat spreader 608. The arm 612 is configured and dimensioned to be received by a latch 616. Once in place, the latch prevents the heat spreader from freely rotating. A front view of the latch and arm can be seen in FIG. 6B.

The underside of the heat spreader 608 that faces the semiconductor module may include a layer 618 of TIM. In some embodiments, the layer 618 is resilient and slightly thicker than the space between the heat spreader 608 and the semiconductor module. Accordingly, in use, the arm 612 is pulled free from the latch 616. The semiconductor module is then mated with the connector 602 such that the semiconductor module is oriented substantially parallel with the circuit board, as described above. The heat spreader 608 is then rotated towards the latch 616 such that the layer 618 of resilient TIM is compressed between the heat spreader 608 and the semiconductor. This resiliency in the layer 618 facilitates contact for thermal conductivity between the semiconductor module and the heat spreader. The arm 612 is then forced into the latch 616, thereby locking the heat spreader and layer 618 into contact with the semiconductor module.

Figure 7:
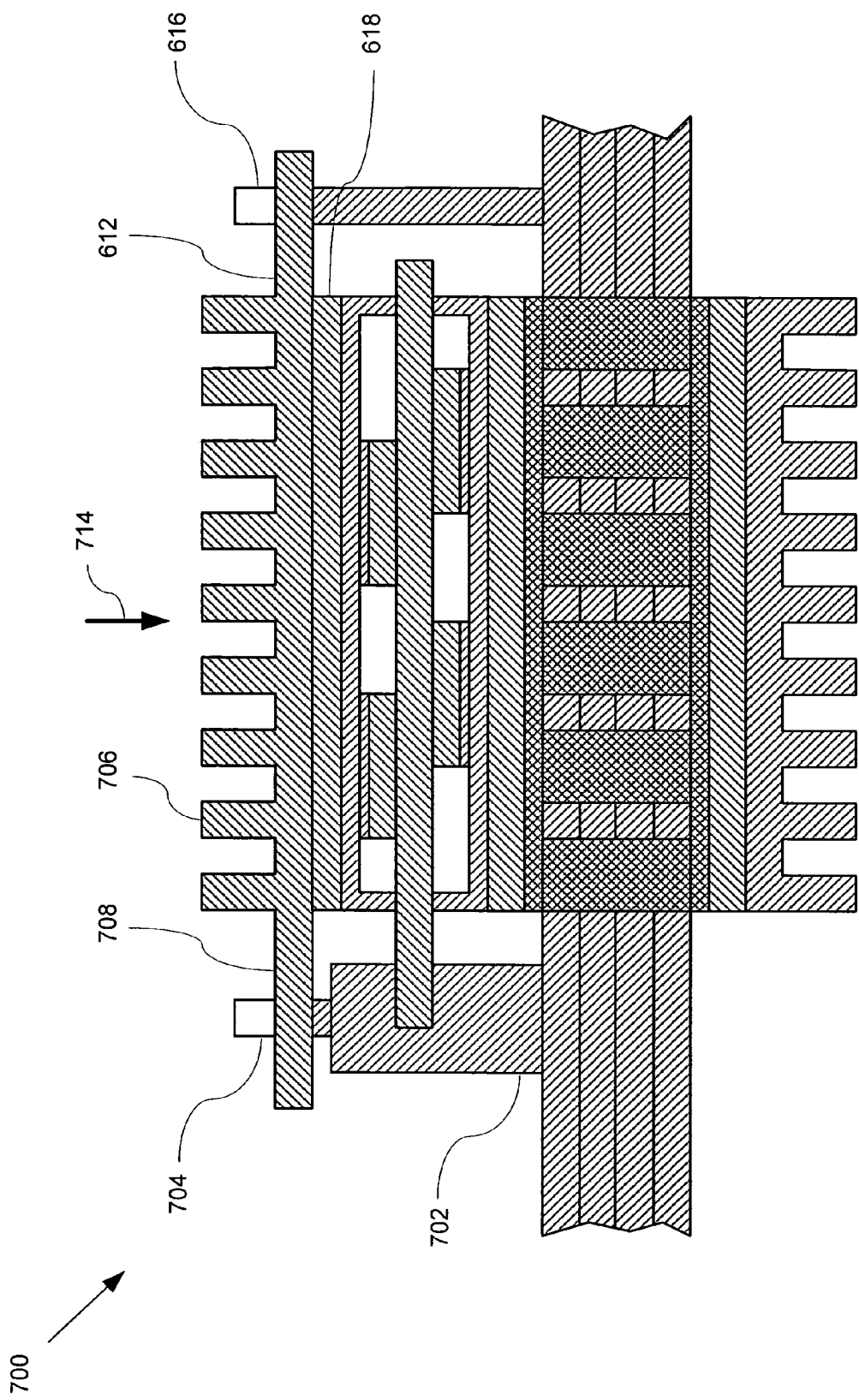

FIG. 7 is a partial cross-sectional view of yet another system 700 for dissipating heat from a semiconductor module. The system 700 is similar to the system 600 shown in FIGS. 6A and 6B. In this embodiment, a connector 702 is coupled to the circuit board 120 (FIG. 1). The connector 702 includes a latch 704 similar to latch 616 described in relation to FIGS. 6A and 6B. A heat spreader 706 is configured to be removably coupled to the circuit board. The heat spreader 706 includes an additional arm 708 that extends in the opposite direction to the arm 612 described in relation to FIG. 6A. In use, the heat spreader 706 is pressed downward towards the circuit board, as shown by arrow 714. In doing so, the arms 708 and 612 engage with the latches 704 and 616 to securely couple the heat spreader 706 to the semiconductor module. In the process of coupling the heat spreader to the semiconductor module, the layer 618 of TIM may be compressed, thereby ensuring adequate thermal contact between the semiconductor and the heat spreader.

Figure 8:
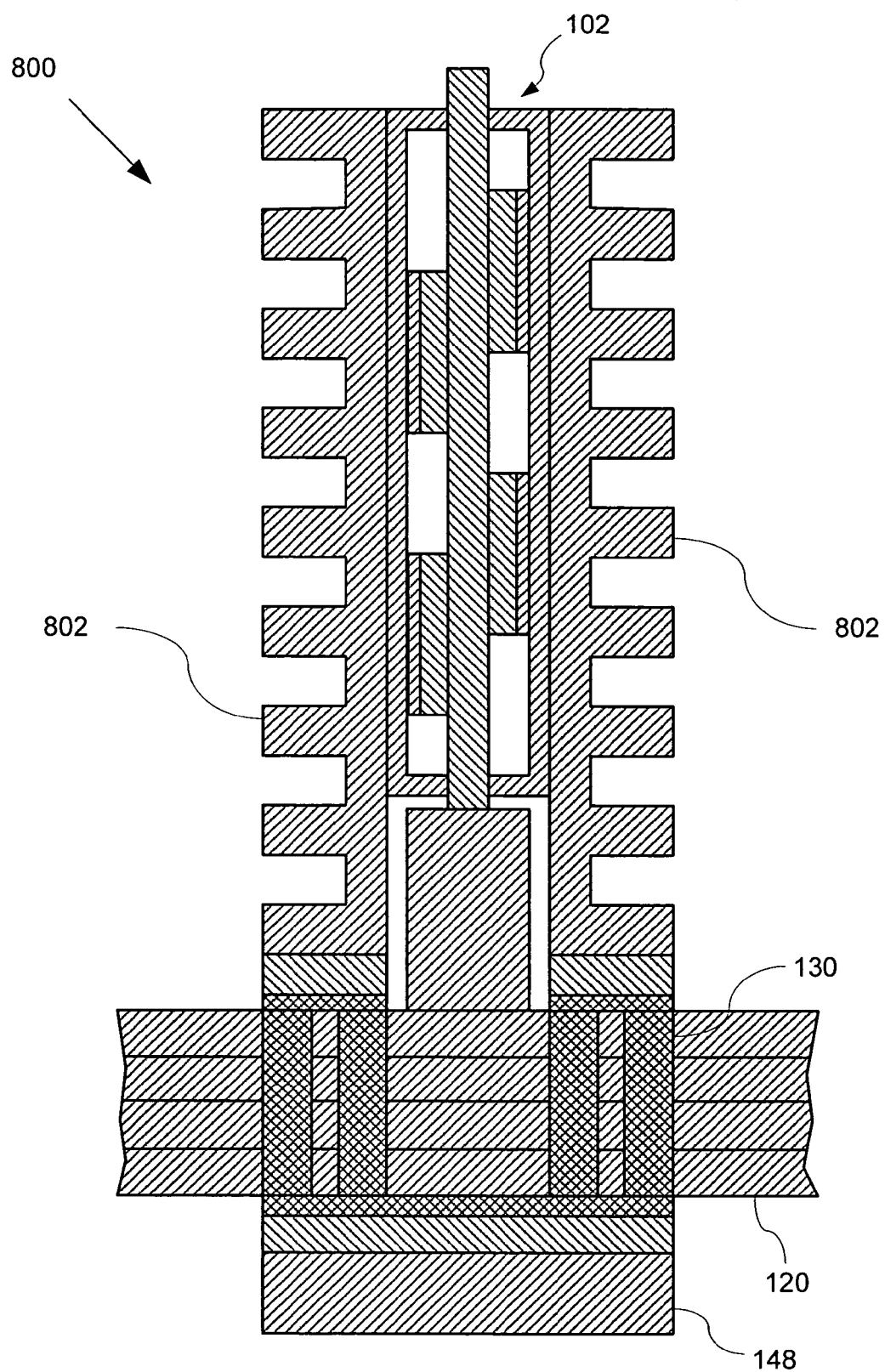

FIG. 8 is a partial cross-sectional view of one other system 800 for dissipating heat from a semiconductor module. As shown, a heat dissipator 148 is positioned on the opposite side of the circuit board 120. In this embodiment the semiconductor module 102 is oriented substantially perpendicular to the circuit board 120 and a heat spreader 802 is placed on each side of the semiconductor module 102. The heat spreaders 802 are thermally coupled to the heat dissipator 148 through one or more layers of TIM and the thermal via(s) 130. In use, heat generated by the semiconductor module 102 is dissipated both from the heat spreaders 802 and the heat dissipator 148.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof.

The presently disclosed embodiments are therefore to be considered in all respects as illustrative and not restrictive, the scope of the invention being indicated by the appended claims, and not limited to the foregoing description.

What is claimed is:

1. A system for dissipating heat from a semiconductor module, comprising:
   a circuit board having a first side and an opposing second side;
   a heat dissipator located at said second side;
   at least one thermal via extending through said circuit board from said first side to said second side, wherein said thermal via is thermally coupled to said heat dissipator at said second side and is configured to thermally couple to a semiconductor module at said first side, and wherein said at least one thermal via is a solid post of thermally conductive material or a hollow via; and
   a connector coupled to said first side of said circuit board, where said connector is configured to couple said semiconductor module to said circuit board.

2. The system of claim 1, further comprising multiple thermal vias.

3. The system of claim 2, wherein said multiple thermal vias form a combined area at said first side that substantially corresponds to an area of said semiconductor module.

4. The system of claim 1, wherein said thermally conductive material is selected from a group consisting of gold, copper, aluminum, magnesium, solder based paste, tungsten, epoxy based alumina, epoxy based boron nitride, epoxy with silica filler and any combination of the aforementioned.

5. The system of claim 1, wherein said hollow via is coated with a thermally conductive material.

6. The system of claim 1, wherein said hollow via is at least partially filled with a thermally conductive material.

7. The system of claim 6, wherein said thermally conductive material is a paste.

8. The system of claim 7, wherein said paste includes materials selected from a group consisting of solder, copper-tungsten mixer, gold, alumina, silica, boron nitride, and any combination of the aforementioned.

9. The system of claim 1, wherein said at least one thermal via forms an area at said first side that substantially corresponds to an area of said semiconductor module.

10. The system of claim 1, further comprising at least one layer of thermally conductive material coupled to said at least one thermal via at said first side of said circuit board.

11. The system of claim 1, further comprising at least one layer of thermally conductive material coupled to said at least one thermal via at said second side of said circuit board.

12. The system of claim 1, further comprising at least one layer of thermally conductive material coupled to said at least one thermal via at said first side of said circuit board, and at least one layer of thermally conductive material coupled to said at least one thermal via at said second side of said circuit board.

13. The system of claim 12, wherein said thermally conductive material is a solid layer of material selected from a group consisting of copper, gold, solder material.

14. The system of claim 12, wherein said thermally conductive material has resilience.

15. The system of claim 12, wherein said thermally conductive material has adhesive properties.

16. The system of claim 12, wherein said heat dissipator is thermally coupled to a layer near said second side of said circuit board.

17. The system of claim 1, wherein said heat dissipator is a heat spreader.

18. The system of claim 1, wherein said heat dissipator is a heat sink.

19. The system of claim 1, wherein said heat dissipator is a heat spreader thermally coupled to another heat spreader.

20. The system of claim 1, wherein said heat dissipator is a heat spreader thermally coupled to a heat sink.

21. A system for dissipating heat from a semiconductor module, comprising:
a circuit board having a first side and an opposing second side;
a heat dissipator located at said second side; and
at least one thermal via extending through said circuit board from said first side to said second side, wherein said thermal via is thermally coupled to said heat dissipator at said second side and is configured to thermally couple to a semiconductor module at said first side, and wherein said at least one thermal via is a solid post of thermally conductive material or a hollow via,
wherein said heat dissipator is a heat spreader thermally coupled to a cooling fan.

22. The system of claim 21,
wherein said heat spreader is thermally coupled to said cooling fan via a heat pipe.

23. A system for dissipating heat from a semiconductor module, comprising:
a circuit board having a first side and an opposing second side;
a heat dissipator located at said second side; and
at least one thermal via extending through said circuit board from said first side to said second side, wherein said thermal via is thermally coupled to said heat dissipator at said second side and is configured to thermally couple to a semiconductor module at said first side, and wherein said at least one thermal via is a solid post of thermally conductive material or a hollow via,
wherein said heat dissipator is a heat pipe coupled to a heat spreader.

24. The system of claim 23, wherein said heat spreader is a computing device's chassis.

25. A system for dissipating heat from a semiconductor module, comprising:
a circuit board having a first side and an opposing second side;
a heat dissipator located at said second side; and
at least one thermal via extending through said circuit board from said first side to said second side, wherein said thermal via is thermally coupled to said heat dissipator at said second side and is configured to thermally couple to a semiconductor module at said first side, and wherein said at least one thermal via is a solid post of thermally conductive material or a hollow via,
wherein said semiconductor module is a Small Outline Dual In-Line Memory Module (SODIMM).

26. The system of claim 1, wherein said semiconductor module is oriented substantially parallel to said circuit board.

27. A system for dissipating heat from a semiconductor module, comprising:
a circuit board having a first side and an opposing second side;
a heat dissipator located at said second side; and
at least one thermal via extending through said circuit board from said first side to said second side, wherein said thermal via is thermally coupled to said heat dissipator at said second side and is configured to thermally couple to a semiconductor module at said first side, and wherein said at least one thermal via is a solid post of thermally conductive material or a hollow via,
wherein said semiconductor module is oriented substantially perpendicular to said circuit board.

28. The system of claim 1, wherein said semiconductor module includes multiple semiconductor devices.

29. The system of claim 1, further comprising an additional heat dissipator configured to be thermally coupled to said semiconductor module.

30. The system of claim 29, wherein said additional heat dissipator is configured to be thermally coupled to a side of said semiconductor remote from said circuit board.

31. The system of claim 29, wherein said additional heat dissipator is a heat spreader or heat sink.

32. A system for dissipating heat from a semiconductor module, comprising:
a circuit board having a first side and an opposing second side;
a heat dissipator located at said second side;
at least one thermal via extending through said circuit board from said first side to said second side, wherein said thermal via is thermally coupled to said heat dissipator at said second side and is configured to thermally couple to a semiconductor module at said first side, and wherein said at least one thermal via is a solid post of thermally conductive material or a hollow via; and
an additional heat dissipator configured to be thermally coupled to said semiconductor module,
wherein said additional heat dissipator is rotatably coupled to said circuit board.

33. The system of claim 29, wherein said additional heat dissipator is removably coupled to said circuit board.

34. A system for dissipating heat from a semiconductor module, comprising:
a circuit board having opposing first and second sides;
a semiconductor module including multiple semiconductor devices, wherein said semiconductor module is oriented substantially parallel to said circuit board near said first side;
a heat dissipator disposed near said second side; and
at least one thermal via at least partially extending through said circuit board to thermally couple said semiconductor module to said heat dissipator, and wherein said at least one thermal via is a solid post of thermally conductive material or a hollow via,
wherein said heat dissipator is a heat conductor coupled to a heat spreader.

35. The system of claim 34, further comprising multiple thermal vias.

36. The system of claim 34, wherein said multiple thermal vias form a combined area near said first side that substantially corresponds to an area of said semiconductor module.

37. The system of claim 34, wherein said thermally conductive material is selected from a group consisting of gold, copper, aluminum, and any combination of the aforementioned.

38. The system of claim 34, wherein said hollow via is coated with a thermally conductive material.

39. The system of claim 34, wherein said hollow via is at least partially filled with a thermally conductive material.

40. The system of claim 39, wherein said thermally conductive material is a paste.

41. The system of claim 40, wherein said paste includes materials selected from a group consisting of solder, copper-tungsten mixer, gold, alumina, silica, and boron nitride.

42. The system of claim 34, wherein said at least one thermal via forms an area near said first side that substantially corresponds to an area of said semiconductor module.

43. The system of claim 34, further comprising a connector coupled to said first side of said circuit board, where said connector is configured to couple said semiconductor module to said circuit board.

44. The system of claim 34, further comprising at least one layer of thermally conductive material coupled to said at least one thermal via at said first side of said circuit board.

45. The system of claim 34, further comprising at least one layer of thermally conductive material coupled to said at least one thermal via at said second side of said circuit board.

46. The system of claim 34, further comprising at least one layer of thermally conductive material coupled to said at least one thermal via at said first side of said circuit board, and at least one layer of thermally conductive material coupled to said at least one thermal via at said second side of said circuit board.

47. The system of claim 46, wherein said thermally conductive material is a solid, is resilient, or contains an adhesive.

48. The system of claim 34, wherein said heat dissipator is a heat spreader or a heat sink.

49. The system of claim 34, wherein said heat dissipator is a heat spreader thermally coupled to a heat sink or another heat spreader.

50. A system for dissipating heat from a semiconductor module, comprising:
    a circuit board having opposing first and second sides;
    a semiconductor module including multiple semiconductor devices, wherein said semiconductor module is oriented substantially parallel to said circuit board near said first side;
    a heat dissipator disposed near said second side; and
    at least one thermal via at least partially extending through said circuit board to thermally couple said semiconductor module to said heat dissipator, and wherein said at least one thermal via is a solid post of thermally conductive material or a hollow via,
    wherein said heat dissipator is a heat spreader thermally coupled to a cooling fan.

51. A system for dissipating heat from a semiconductor module, comprising:
    a circuit board having opposing first and second sides;
    a semiconductor module including multiple semiconductor devices, wherein said semiconductor module is oriented substantially parallel to said circuit board near said first side;
    a heat dissipator disposed near said second side; and
    at least one thermal via at least partially extending through said circuit board to thermally couple said semiconductor module to said heat dissipator, and wherein said at least one thermal via is a solid post of thermally conductive material or a hollow via,
    wherein said heat dissipator is a heat spreader thermally coupled to a cooling fan via a heat pipe.

52. The system of claim 34, wherein said heat spreader is a computing device's chassis.

53. A system for dissipating heat from a semiconductor module, comprising:
    a circuit board having opposing first and second sides;
    a semiconductor module including multiple semiconductor devices, wherein said semiconductor module is oriented substantially parallel to said circuit board near said first side;
    a heat dissipator disposed near said second side; and
    at least one thermal via at least partially extending through said circuit board to thermally couple said semiconductor module to said heat dissipator, and wherein said at least one thermal via is a solid post of thermally conductive material or a hollow via,
    wherein said semiconductor module is a Small Outline Dual In-Line Memory Module (SODIMM).

54. The system of claim 34, wherein said semiconductor module is oriented substantially parallel to said circuit board.

55. A system for dissipating heat from a semiconductor module, comprising:
    a circuit board having opposing first and second sides;
    a semiconductor module including multiple semiconductor devices, wherein said semiconductor module is oriented substantially parallel to said circuit board near said first side;
    a heat dissipator disposed near said second side; and
    at least one thermal via at least partially extending through said circuit board to thermally couple said semiconductor module to said heat dissipator, and wherein said at least one thermal via is a solid post of thermally conductive material or a hollow via,
    wherein said semiconductor module is oriented substantially perpendicular to said circuit board.

56. The system of claim 34, further comprising an additional heat dissipator configured to be thermally coupled to said semiconductor module.

57. The system of claim 56, wherein said additional heat dissipator is configured to be thermally coupled to a side of said semiconductor remote from said circuit board.

58. The system of claim 56, wherein said additional heat dissipator is a heat spreader or heat sink.

59. A system for dissipating heat from a semiconductor module, comprising:
    a circuit board having opposing first and second sides;
    a semiconductor module including multiple semiconductor devices, wherein said semiconductor module is oriented substantially parallel to said circuit board near said First side;
    a heat dissipator disposed near said second side;
    at least one thermal via at least partially extending through said circuit board to thermally couple said semiconductor module to said heat dissipator, and wherein said at least one thermal via is a solid post of thermally conductive material or a hollow via; and
    an additional heat dissipator configured to be thermally coupled to said semiconductor module;
    wherein said additional heat dissipator is rotatably coupled to said circuit board.

60. The system of claim 56, wherein said additional heat dissipator is removable coupled to said circuit board.

61. A system for dissipating heat from a semiconductor module, comprising:
    a means for interconnecting electrical components, said means for interconnecting electrical components having a first side and an opposing second side;
    at least one means for thermally coupling components, said means for thermally coupling components extending at least partially through said circuit board from said first side to said second side, and wherein said at least one means for thermally coupling components is a solid post of thermally conductive material or a hollow via; and
    a means for dissipating heat, said means for dissipating heat thermally coupled to said at least one means for thermally coupling components at said second side, wherein said at least one means for thermally coupling components is configured to thermally couple to a semiconductor module at said first side,
    wherein said semiconductor module is a Small Outline Dual In-Line Memory Module (SODIMM).

62. The system of claim 61, further comprising multiple means for thermally coupling components.

63. The system of claim 61, wherein said at least one means for thermally coupling components is a hollow via coated with a thermally conductive material, or a hollow via that is at least partially filled with a thermally conductive material.

64. The system of claim 61, further comprising a means for connecting coupled to said first side of said means for interconnecting electrical components, where said means for connecting is configured to couple said semiconductor module to said means for interconnecting electrical components.

65. The system of claim 61, further comprising at least one layer of thermally conductive material coupled to said means for thermally coupling components near at least one of said first side and said second side.

66. The system of claim 61, wherein said means for dissipating heat is selected from the group consisting of at least one of: a heat spreader, a heat sink, a cooling fan, a heat pipe, and any combination of the aforementioned.

67. The system of claim 61, wherein said semiconductor module is oriented substantially parallel to said circuit board.

68. The system of claim 61, wherein said semiconductor module includes multiple semiconductor devices.

69. The system of claim 61, further comprising an additional means for dissipating heat configured to be thermally coupled to said semiconductor module.

70. The system of claim 69, wherein said additional means for dissipating heat is configured to be thermally coupled to a side of said semiconductor remote from said means for interconnecting electrical components.

71. The system of claim 69, wherein said additional means for dissipating heat is selected from the group consisting of at least one of: a heat spreader, a heat sink, a cooling fan, a heat pipe, and any combination of the aforementioned.

72. A system for dissipating heat from a semiconductor module, comprising:
  a means for interconnecting electrical components, said means for interconnecting electrical components having a first side and an opposing second side;
  at least one means for thermally coupling components, said means for thermally coupling components extending at least partially through said circuit board from said first side to said second side, and wherein said at least one means for thermally coupling components is a solid post of thermally conductive material or a hollow via; and
  a means for dissipating heat, said means for dissipating heat thermally coupled to said at least one means for thermally coupling components at said second side, wherein said at least one means for thermally coupling components is configured to thermally couple to a semiconductor module at said first side,
  wherein said additional heat dissipator is rotatably coupled to said circuit board.

73. The system of claim 69, wherein said additional heat dissipator is removably coupled to said circuit board.

74. A system for dissipating heat from a semiconductor module, comprising:
  a semiconductor module located on one side of a circuit board;
  a heat dissipator located on the other side of the circuit board; and
  at least one thermal via extending through the circuit board to thermally couple the semiconductor module to the heat dissipator, and wherein said at least one thermal via is a solid post of thermally conductive material or a hollow via;
  wherein said heat dissipator is a heat pipe coupled to a heat spreader.

75. The system of claim 25, further comprising multiple thermal vias, wherein said multiple thermal vias form a combined area at said first side that substantially corresponds to an area of said semiconductor module.

76. The system of claim 27, further comprising multiple thermal vias, wherein said multiple thermal vias form a combined area at said first side that substantially corresponds to an area of said semiconductor module.

77. The system of claim 55, further comprising multiple thermal vias, wherein said multiple thermal vias form a combined area near said first side that substantially corresponds to an area of said semiconductor module.

* * * * *